United States Patent [19]

Dawson

[11] Patent Number: 4,479,251
[45] Date of Patent: Oct. 23, 1984

[54] NOISE BLANKER

[75] Inventor: Sylvan L. Dawson, Marion, Iowa

[73] Assignee: Rockwell International Corporation, El Segundo, Calif.

[21] Appl. No.: 395,221

[22] Filed: Jul. 6, 1982

[51] Int. Cl.³ .............................................. H04B 1/10
[52] U.S. Cl. .................................... 455/219; 455/223
[58] Field of Search .............. 455/219, 222, 223, 224, 455/311, 212; 375/104

[56] References Cited

U.S. PATENT DOCUMENTS

| | | | |
|---|---|---|---|
| 3,230,458 | 1/1966 | Stangeland | 325/410 |
| 3,620,631 | 11/1971 | Stopka et al. | 325/404 |
| 3,699,457 | 10/1972 | Wright | 455/224 |
| 3,725,674 | 4/1973 | Schaeffer et al. | 455/223 |
| 4,024,463 | 5/1977 | Pelley | 330/138 |
| 4,189,679 | 2/1980 | Amazawa et al. | 455/224 |
| 4,216,430 | 8/1980 | Amazawa et al. | 455/219 |

Primary Examiner—Marc E. Bookbinder
Attorney, Agent, or Firm—Richard K. Robinson; George A. Montanye; H. Fredrick Hamann

[57] ABSTRACT

A noise blanker circuit protects a signal processing circuit from unwanted noise spikes by interrupting the signal path when it exceeds a preestablished threshold or reference level. The detector itself is a two branch detector that has in one branch a variable gain amplifier that is controlled by an automatic gain control signal and a comparator. The other branch of the circuit has a delay network which delays the signal by the propagation delay of the variable gain amplifier in the comparator and applies it to a switch, which when activated by the output signal from the comparator, will interrupt the second branch to ground and thus protect the remainder of the circuit.

7 Claims, 3 Drawing Figures

NOISE BLANKER

BACKGROUND OF THE INVENTION

This invention relates to noise blanker circuits and in particular to noise blanker circuits for radio receivers that are used to protect the IF section of the receiver from noise spikes.

The operation of communication equipment such as a radio receiver may be adversely affected and even damaged by random noise pulses such as lightning pulses or ignition noise. The magnitude of these noise pulses are large enough so as to only be degraded but not removed from signals with filtering or other prior art techniques including limiters, clamp circuits and other type of noise protection devices.

SUMMARY OF THE INVENTION

A noise blanker circuit protects a signal processing circuit from unwanted noise spikes by interrupting the signal path when it exceeds a preestablished threshold or reference level. The detector itself is a two branch detector that has in one branch a variable gain amplifier that is controlled by an automatic gain control signal and a comparator. The other branch of the circuit has a delay network which delays the signal by the propagation delay of the variable gain amplifier in the comparator and applies it to a switch, which when activated by the output signal from the comparator, will interrupt the second branch and thus protect the remainder of the circuit.

It is the objective of this invention to provide a noise blanking circuit in which the length of the blanking pulse is proportional to the length of the noise pulse which enables the blanking circuit to be effective on lightning, ignition noise or other pulses of random characteristics.

It is another objective of the invention to provide a noise blanking circuit in which the blanking level is constant over a wide signal range due to the gain control characteristic of the circuit.

It is another objective of the invention to provide a noise blanking circuit in which the blanking level is not disturbed by noise pulses because the gain of the blanking signal is controlled by an Automatic Gain Controlled (AGC) voltage that is protected from the noise pulse.

It is another objective of the invention to provide a noise blanking circuit in which there is no inherent time delay in the noise level detector.

The advantages and objects of the invention, and the means by which they are achieved may be best appreciated by referring to the Detailed Description of the Preferred Embodiment which follows hereafter together with the appended drawings.

DETAILED DESCRIPTION OF THE PREFERRED EMBODIMENT

Figure 1:
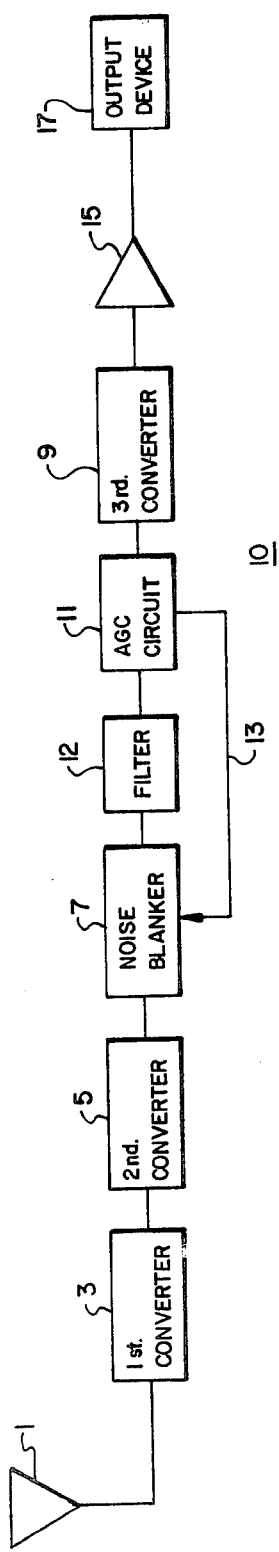
FIG. 1 is a block diagram of a radio receiver containing a noise blanker circuit according to the invention.

In FIG. 1, to which reference should now be made, there is shown a signal processing circuit such as a radio receiver 10 that receives radio signals via an antenna 1. The radio frequency signal that is detected by the antenna 1 is passed to a first converter 3 where the signal through mixing and filtering is up converted to a first intermediate frequency signal that, in the preferred embodiment, has a bandwidth of normally around 20 kHz and a center frequency of 109.35 Mhz. The first intermediate frequency signal is passed to a second down converter 5 where it is down converted to the second intermediate frequency signal that, in the embodiment illustrated, has a center frequency of around 450 kHz. The down converted signal is passed to a noise blanker circuit 7 which insures that any noise spikes are removed from the second intermediate frequency signal prior to its being applied to a third converter 9. The noise blanker circuit 7 is controlled by an automatic gain control signal that is generated by the AGC circuit 11 and applied to the noise blanker 7 via conductor 13. It is important to point out that the AGC circuit 11 occurs in the signal processing chain downstream from the noise blanker and is thus protected by the noise blanker and, consequently, the blanking level is not disturbed by the noise pulses. The gain controlled second intermediate frequency signal is then passed to the third converter 9 for further down conversion, usually to the audio frequency range, and on to an audio amplifier 15 and the output device 17 which is a terminal or a speaker.

Figure 2:
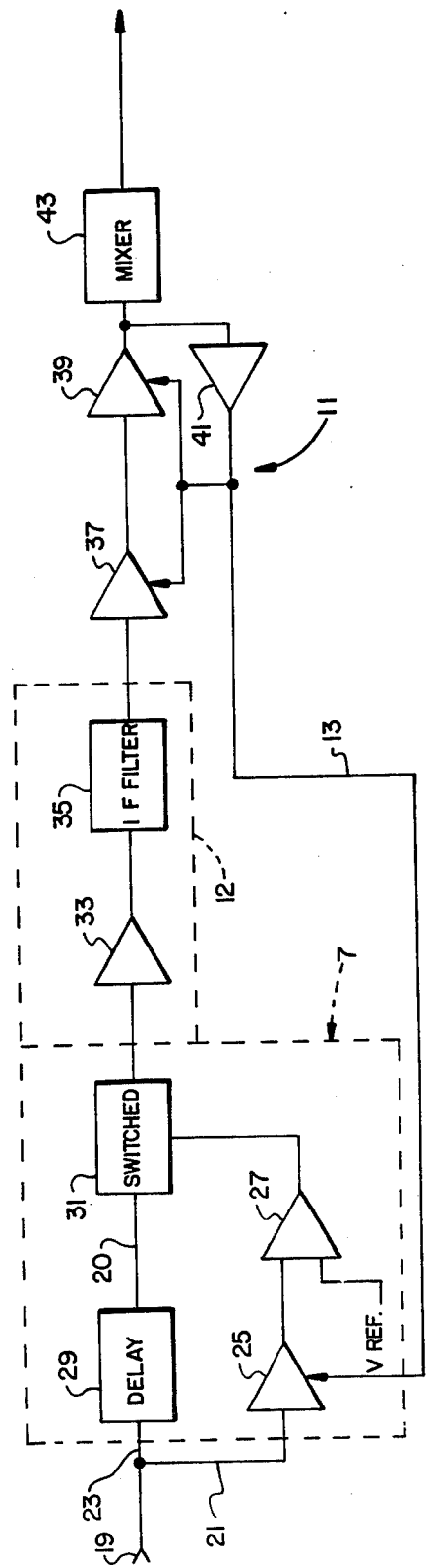
FIG. 2 is a block diagram of the noise blanker circuit of FIG. 1.

FIG. 2 is a block diagram of the noise blanker circuit 7 and the automatic gain control circuit 11. The second intermediate frequency signal is applied to the noise blanker circuit 7 at terminal 19 and is split into a first path 21 and a second path 23. The first path 21 has a series connection of a variable gain amplifier 25 and a comparator 27. The second path 23 has a delay 29 and a switch 31. The delay 29 delays that portion of the second intermediate frequency signal that is present on second path 23 by the propagation delays of the variable gain amplifier 25, the comparator 27, and the activate time of the switch 31. The output of the noise blanker is applied to a filter 12 that includes an amplifier 33 and an intermediate frequency filter 35 that has a bandpass in the preferred embodiment of approximately 3 kHz. The filtered output is applied to the AGC circuit 11 that includes a first variable gain amplifier 37, a second variable gain amplifier 39 and a feedback amplifier 41. The AGC circuit 11 may be any of the AGC circuits known in the Art including my copending application, entitled "Automatic Gain Control Circuit", Ser. No. 395,222 filed simultaneously herewith and by reference incorporated herein. The automatic gain level is obtained and a control signal is provided from the amplifier 41 to the first variable gain amplifier 37 and the second variable gain amplifier 39 as well as to the variable gain amplifier 25 via conductor 13. The output of the amplifier 39 is applied to the third down converter 9 which first stage is a mixer 43 which down converts the controlled intermediate frequency signal to the desired output frequency range which, in the case of a radio receiver, is the audio frequency range.

The location of the automatic gain control circuit 11 after, from a signal processing sense, the noise blanker 7 insures that the automatic gain control circuit 11, as well as the control voltage that is present on conductor 13, are protected from noise pulses by the noise blanker circuit 7. The control signal controls the gain of the variable gain amplifier 25 to insure that a constant voltage level is applied to the comparator 27 for comparison with a selectable referenced potential, VREF. If a noise pulse that is present at terminal 19 and applied to the first branch 21 is amplified by the variable gain amplifier 25 by a gain that is established by the gain control signal that is present on conductor 13 exceeds the selectable reference potential, VREF, then the comparator 27 will have an output signal level that will cause the switch 31 to interrupt the signal that is present on conductor 20 and thereby protect the amplifier 33 and the remainder of the circuit that occurs downstream in the signal processing chain.

Figure 3:
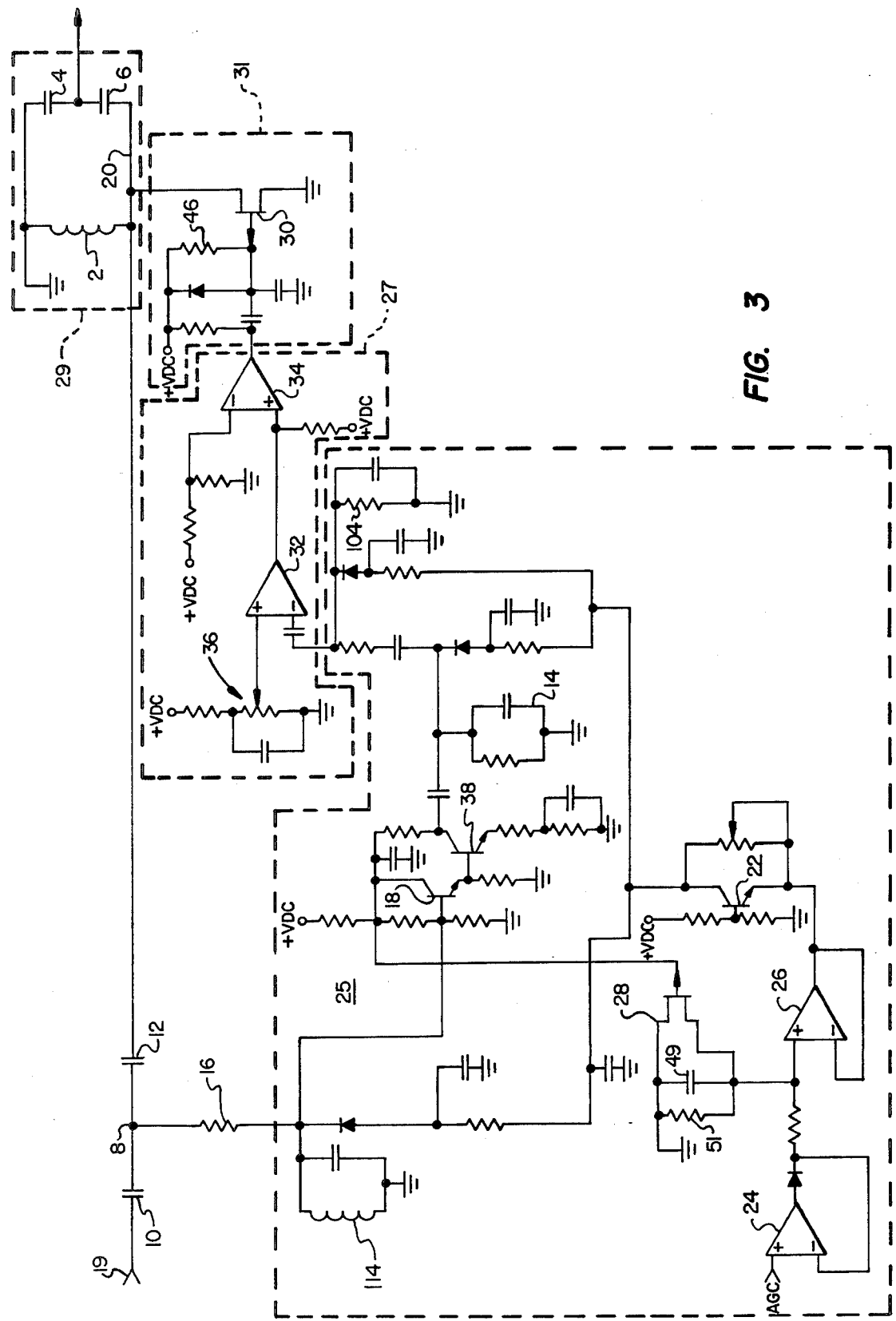
FIG. 3 is a schematic diagram of the noise blanker circuit of FIG. 2.

FIG. 3, to which reference should now be made, is a schematic diagram of the noise blanker 7 and includes a switch 31 that is a field effect transistor 30. The delay 29 comprises an inductor capacitor network that includes the inductor 2 and capacitors 4 and 6. The second intermediate frequency signal is conducted from terminal 19 to node point 8 by a coupling capacitor 10. Capacitor 12 couples the second intermediate frequency signal from node point 8 to the delay 29. A current limiting resistor 16 couples the second intermediate frequency signal to the variable gain amplifier 25 that includes transistors 18, 38 and 22 and operational amplifiers 24 and 26. The output of the variable gain amplifier 25 is applied to the comparator 27 that includes operational amplifiers 32 and 34. The signal level that is present on the negative terminal of the amplifier 32 is compared with the voltage reference that is provided by the voltage reference source 36 and the difference is applied to the amplifier 34 for amplification. The output of amplifier 34 is applied to a filter network 46 for filtering and when the magnitude of the signal that is present on the negative terminal of the amplifier 32 is greater than the DC voltage level on the positive terminal of the amplifier 32 the FET switch 30 will conduct interrupting the signal path by shorting conductor 20 to ground.

A delay time is provided to the AGC signal by the RC time constant provided by capacitor 49 and resistor 51. In the event the noise blanker loses power, the AGC signal is prevented from charging capacitor 49 by FET 28 which acts as a normally closed switch. The presence of DC power causes FET 28 to open removing the short circuit across capacitor 49.

Many changes and modifications in the above described invention can, of course, be carried out without departing from the scope thereof. Accordingly, the invention is intended to be limited only by the scope of the appended claims.

I claim:
1. A signal processing system comprising:
    means for receiving a signal to be processed and including a first signal path and a second signal path;
    means coupled to said first signal path for providing a first output of said signal and interrupting said first output in response to a first control signal;
    means coupled to said second signal path for providing a variably amplified second output of said signal to be processed which is variable in response to a second control signal;
    means for comparing the second output with a reference signal for generating said first control signal; and
    means coupled to said means for providing said first output for providing an automatic gain control signal and variably amplifying said first output in response to said automatic gain control signal, said automatic gain control signal also being coupled as said second control signal.

2. The signal processing circuit of claim 1 wherein said means for providing said first output is a switch having an input terminal, an output terminal, and a control terminal wherein said input terminal is coupled to receive said signal to be processed, said output terminal is coupled to provide said signal to be processed as said first output, and said control terminal is coupled to receive said first control signal to interrupt said first output in response to said first control signal.

3. The system of claim 1 wherein said first signal path includes a means for providing a time delay for delaying the coupling of the signal to be processed to said means for providing said first output.

4. The system of claim 1 wherein said means for providing a time delay is a delay line.

5. The system of claim 1 further including means for bandpass filtering said first output connected prior to said automatic gain control signal providing means.

6. The system of claim 1 wherein said means for comparing comprises a comparator constructed and arranged to provide said first control signal in response to said second output exceeding said reference signal.

7. A signal processing system comprising:
    a first input terminal coupled to receive a signal to be processed;
    a first signal path including a delay line having an input terminal and an output terminal for providing a delay of any signal applied to its input terminal, the input terminal of said delay line being coupled to said first input terminal, and a switch having an input terminal coupled to the output terminal of said delay line, an output terminal for providing an output of any signal on the input terminal of said switch, and a control terminal for interrupting a signal on the output terminal of said switch in response to a first control signal;
    a second signal path having a first variable gain amplifier including an input terminal, an output terminal, and a control terminal for varying the amplification of a signal applied to the input terminal of said variable gain amplifier in response to a second control signal to provide an amplified signal on the output terminal of said variable gain amplifier, and a comparator having a first input terminal coupled to the output terminal of said variable gain amplifier, a second input terminal coupled to receive a reference signal, and an output terminal coupled to said control terminal of said switch to provide said first control signal when a signal at the input of the first input terminal of said comparator exceeds the reference signal on the second input terminal of said comparator;
    at least one second variable gain amplifier having an input terminal, an output terminal, and control terminal, said at least one second variable gain amplifier having its input terminal coupled to the output terminal of said switch and its output terminal coupled to provide a variably amplified output of a signal received by the input terminal of said at least one second variable gain amplifier in response to a third control signal; and
    an automatic gain control circuit having an input terminal coupled to the output terminal of said at least one second variable gain amplifier and an output terminal coupled to the control terminal of said first variable gain amplifier and to the control terminal of said at least one second variable gain amplifier to provide an automatic gain control signal as said second and third control signal.
* * * * *